United States Patent [19]

von Basse et al.

[11] 4,126,881
[45] Nov. 21, 1978

[54] SEMICONDUCTOR MEMORY

[75] Inventors: Paul-Werner von Basse, Wolfratshausen; Rüdiger Hofmann, Munich, both of Germany

[73] Assignee: Siemens Aktiengesellschaft, Berlin & Munich, Germany

[21] Appl. No.: 825,225

[22] Filed: Aug. 17, 1977

[30] Foreign Application Priority Data

Sep. 22, 1976 [DE] Fed. Rep. of Germany ....... 2642615

[51] Int. Cl.² ............................................. H01L 29/06
[52] U.S. Cl. ........................................ 357/55; 357/22; 357/23; 357/41; 357/45
[58] Field of Search ...................... 357/22, 23, 55, 41, 357/45

[56] References Cited

U.S. PATENT DOCUMENTS 4,003,036  1/1977  Jenne ...................................... 357/23

*Primary Examiner*—Edward J. Wojciechowicz
*Attorney, Agent, or Firm*—Hill, Gross, Simpson, Van Santen, Steadman, Chiara & Simpson

[57] ABSTRACT

A semiconductor memory has storage cells composed of MOS selector transistors operated by a drive line and storage capacitors connected to selector transistors. The selector transistors are constructed in accordance with the V-MOS technique. A semiconductor substrate is highly doped with atoms of one conductivity type and carries a buried layer highly doped with atoms of the opposite conductivity type. An epitaxial layer, weakly doped with atoms of the one conductivity type is carried over the buried layer and the semiconductor substrate. A second layer, highly doped with atoms of the opposite conductivity type, is carried over the epitaxial layer above the buried layer. A V-shaped groove divides the second layer into two sub-portions in the region of the storage cells and extends into the buried layer and a conductor path is disposed in the groove.

6 Claims, 4 Drawing Figures

SEMICONDUCTOR MEMORY

BACKGROUND OF THE INVENTION

1. Field Of The Invention

The invention relates to a semiconductor memory having storage cells comprising MOS selector transistors operated by a drive line, and storage capacitors connected to the selector transistors, wherein the selector transistors are produced in accordance with the V-MOS technique.

2. Description Of The Prior Art

Single-transistor storage cells constructed in the MOS technique are known (see e.g. *Electronics*, Sept. 31, 1973, pages 116 to 121). These single-transistor storage cells comprise a selector transistor and a storage capacitor connected to the selector transistor. The selector transistor is connected by its control electrode to the word line of the semiconductor memory. The controlled path of the selector transistor is connected between a bit line and the storage capacitor. The other terminal of the storage capacitor is connected to a fixed voltage, e.g. the voltage VDD. The information to be stored in the storage cell is determined by the charge of the storage capacitor. The write-in and read-out of an item of information into and out of the storage cell is effected via the selector transistor, when the latter is operated from the word line.

Heretofore, the design of single-transistor storage cells constructed in the MOS technique has been such that the storage capacitor is arranged adjacent to the selector transistor on a semiconductor substrate. However, this has the disadvantage that a relatively large space requirement was needed to construct a storage cell.

It is also known that it is possible to construct MOS transistors in a semiconductor substrate employing the so-called V-MOS technique (see e.g. *Solid State Electronics*, 1976, vol. 19, pages 159 to 166, *Electronics Letters*, Sept. 20, 1973, vol. 19, No. 19, pages 457 to 458). In this V-MOS technique, on a silicon semiconductor substrate there is applied an epitaxial layer in which the transistor is arranged. Here the control electrode is formed in that a V-shaped groove is etched into the epitaxial layer, the groove is insulated, by an insulating layer of silicon oxide, whereupon the terminal for the control electrode of the transistor is applied. The controlled electrodes of the transistor can be arranged adjacent the control electrode in the epitaxial layer. The channel of the MOS transistor is formed along the edges of the V-shaped groove. Reference is made to the aforementioned publications in respect of the properties and advantages of the V-MOS technique and the production method.

SUMMARY OF THE INVENTION

The object of the invention is to provide a semiconductor store which has single-transistor storage cells and is constructed in the V-MOS technique.

This object is realized in that in a semiconductor substrate, highly doped with disturbance centers of the one conductivity type, there is arranged a layer (a buried layer) highly doped with disturbance centers of the other type. An epitaxial layer which is weakly doped with disturbance centers of the one conductivity type is arranged above the buried layer and the semiconductor substrate. A second layer which is highly doped with disturbance centers of the other conductivity type is arranged in the surface of the epitaxial layer above the buried layer. A V-shaped groove is provided which divides the second layer into two sub-portions in the region of the storage cells and extends into the buried layer, and a conductor path is arranged in the V-shaped groove.

A layer doped with disturbance centers of the one conductivity type is to be understood as a layer which contains, e.g. acceptors, and thus is p-doped. Correspondingly, a layer doped with disturbance centers of the other conductivity type is to be understood as a layer in which donors are arranged, and thus is n-doped. Naturally, the coordination between disturbance centers of the one conductivity type and the doping can also be reversed.

When the semiconductor memory is constructed in accordance with the V-MOS technique, there is always only one row of storage cells arranged in the region below the V-shaped groove. Here, the second layer, which is divided into two subportions by the V-shaped groove in the region of the storage cells, forms the bit line, whereas the conductor path which passes through the V-shaped groove is arranged in the word line. Then, to storage cell is, in each case, formed at the intersection between the word line and the sub-portions of the bit line. Here, every storage cell possesses two selector transistors which are connected in parallel. The one selector transistor is arranged on the one edge of the V-shaped groove and is formed by the one sub-portion of the bit line, the buried layer and the conductor path which runs along the one edge, whereas the second selector transistor is arranged on the other edge of the V-shaped groove and is formed by the second sub-portion of the bit line, the buried layer and the conductor path which runs along the second edge. The channels of the selector transistors are each formed along the edge of the V-shaped groove between the buried layer and a sub-portion of the bit line. The storage capacitor is formed with the aid of the buried layer and, in fact, by the blocking layer capacitance which exists between the buried layer and the surrounding semiconductor substrate.

The buried layer which constitutes the storage capacitance is advantageously of spherical design, or of an approximately spherical design. This serves to produce a large buried layer surface.

The advantages of the semiconductor store corresponding to the invention reside in the fact that the selector transistors and the storage capacitor relating to each storage cell are arranged one above another. The bit line capacitance remains relatively low. This consists of the capacitance between the conductor path portions along the edges of the V-shaped groove and the sub-portions of the bit line and between the sub-portions of the bit line and the surrounding epitaxial layer. A low bit line capacitance is advantageous as it enables a relatively large read-out signal to be attained with a fixed memory capacitance. In this way the read-out amplifiers can be simplified. If, on the other hand, smaller read-out signals can be processed, the storage capacitances can be reduced. Both techniques result in reductions in area in the cell field and in the read-out amplifiers.

A further advantage resides in the fact that, by virtue of the spherical shape of the buried layer, it is possible to achieve a relatively large storage capacitance. An increased storage capacitance additionally leads to enlarged read-out signals or corresponding reductions in area in accordance with the above principles.

BRIEF DESCRIPTION OF THE DRAWINGS

Other objects, features, and advantages of the invention, its organization, construction and operation will be understood from the following description, taken in conjunction with the accompanying drawings, on which.

DESCRIPTION OF THE PREFERRED EMBODIMENT

Figure 1:
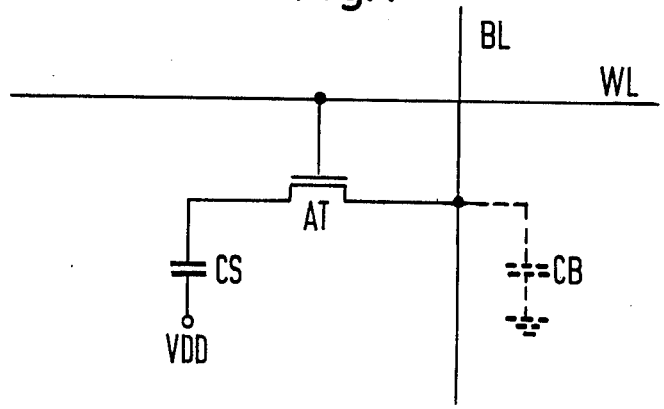
FIG. 1 is a schematic circuit diagram of a single-transistor storage cell constructed in accordance with the MOS technique.

A known single-transistor storage cell in the MOS technique is illustrated in FIG. 1 comprises of a selector transistor AT and a storage capacitor CS. The storage cell is connected between a word line WL and a bit line BL. The control electrode of the selector transistor AT here is connected to the word line WL, whereas the controlled path of the selector transistor AT lies between the bit line BL and the storage capacitor CS. The other terminal of the control capacitor CS is connected to a fixed voltage VDD. The charge characterizing an item of information is, in each case, stored in the storage capacitor CS. The charge can be transferred to the bit line BL via the selector transistor AT. This takes place whenever the word line WL is operated appropriately. The bit line capacitance is referenced CB.

Figure 2:
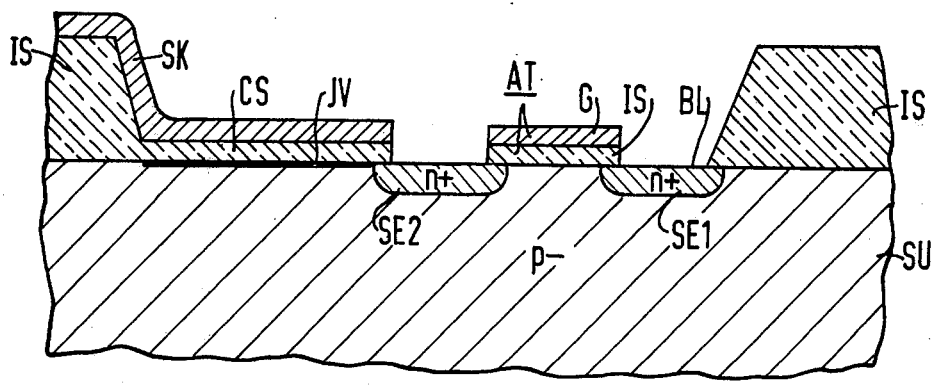
FIG. 2 is a cross-sectional view taken through a single-transistor storage cell in an n-channel silicon gate technique.

FIG. 2 shows the construction of a single-transistor storage cell in accordance with the known n-channel silicon gate technique. Here the storage capacitor CS and the selector transistor AT are arranged adjacent one another on a silicon semiconductor substrate SU. A pair of controlled electrodes SE1 and SE2 are diffused into the semiconductor substrate SU. A control electrode G is arranged between the controlled electrodes SE1 and SE2, partially overlapping the latter and insulated relative to the semiconductor substrate SU. The one controlled electrode SE1 lies in the bit line BL. The other controlled electrode SE2 is connected to the storage capacitor CS. This electrode is formed with the aid of a conductor path SK which is arranged in insulated fashion above the semiconductor substrate SU. If an appropriate voltage is connected to the conductor path SK, on the surface of the semiconductor substrate SU there forms an inversion layer IV which is connected to the controlled electrode SE2 of the selector transistor AT. The insulating layers IS which are required to construct the storage capacitor CS and the selector transistor AT can consist of silicon oxide. The control electrode G of each selector transistor AT can be designed in polysilicon. In any case it can be seen from FIG. 2 that the storage capacitor CS and the selector transistor AT of the single-transistor storage cell are arranged next to one another on the semiconductor substrate SU and thus a relatively large space requirement is needed to construct storage cells of this type.

This space requirement can be substantially reduced by constructing the selector transistors in the V-MOS technique. The arrangement of the storage cells in this technique can best be explained with reference to FIG. 4 which is a cross-sectional view through a single-transistor storage cell constructed in the V-MOS technique.

A layer BU which is highly n-doped (n+) is diffused into a silicon semiconductor substrate SU which is highly p-doped (p+). In this way, between the semiconductor substrate SU and the layer BU, which in the following will be referred to as buried layer, there forms a blocking layer which can be used to construct the storage capacitor. The storage capacitance of this storage capacitor is referenced CS.

An epitaxial layer E is arranged on the buried layer BU and the semiconductor substrate SU. The epitaxial layer E is weakly p-doped (p−).

Figure 3:
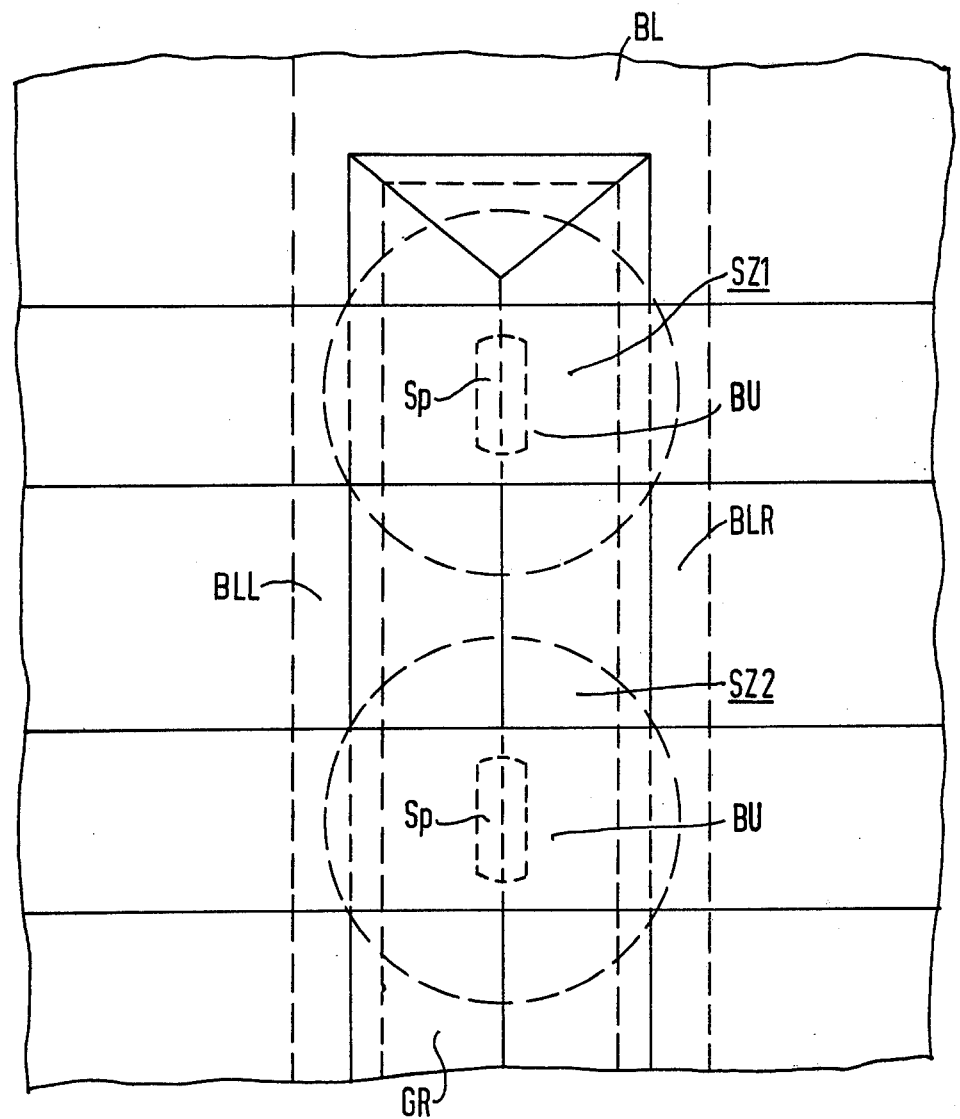
FIG. 3 is a plan view of two single-transistor storage cells constructed in accordance with the V-MOS technique.

A second layer (BL) which is highly n-doped (n+) is diffused-in above the buried layer BU on the surface of the epitaxial layer E. Then this second layer BL and the epitaxial layer are divided up above the buried layer BU by a V-shaped groove GR (as shown in FIG. 3). The V-shaped groove GR extends into the buried layer BU. In this way the second layer BL is divided into two sub-portions, and in fact into a pair of sub-portions BLL and BLR. An insulating layer IS which can consist, for example, of silicon dioxide is applied to the epitaxial layer E, including the V-shaped groove GR. Upon this insulating layer IS there is arranged a conductor path LB which also passes through the V-shaped groove GR. The conductor path LB can consist of polysilicon and constitute the word line WL of the storage cell. The second layer BL and the sub-portions BLL and BLR then form the bit line of the storage cell.

Figure 4:
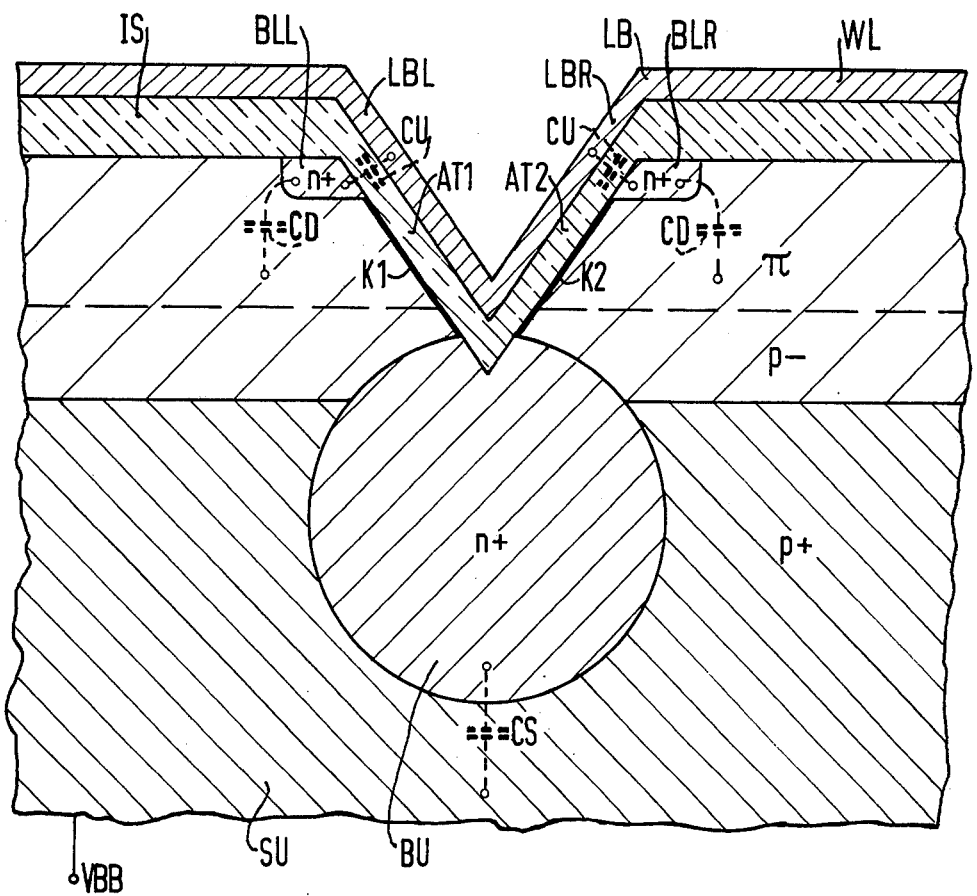
FIG. 4 is a cross-sectional view through a single-transistor storage cell constructed in the V-MOS technique.

As can be seen from FIG. 4, each storage cell comprises of the buried layer BU as storage capacitor and of selector transistors AT1 and AT2 which are arranged along the edges of the V-shaped groove GR. By dividing the bit line BL into two bit line portions BLL and BLR, in respect of each storage cell, two selector transistors are constructed. The one selector transistor AT1 here is connected between the bit line portion BLL and the buried layer BU. Its control electrode is formed by the conductor path portion LBL along the edge of the V-shaped groove GR. When an appropriate voltage is connected to the word line WL, a channel K1 is formed between the bit line portion BLL and the buried layer BU. The second selector transistor AT2 is connected between the bit line portion BLR and the buried layer BU. Its control electrode is formed by the conductor path portion LBR on the other edge of the V-shaped groove GR. An appropriate voltage connected to the word line WL produces its channel K2 between the bit line portion BLR and the buried layer BU. As the bit line portions BLL and BLR recombine at the end of the storage field (as shown in FIG. 3), and on the other hand the buried layer BU is the same for both selector transistors AT1 and AT2, the two selector transistors in respect of each storage cell are connected in parallel. They additionally lie in the same word line WL.

A charge transfer takes place between the buried layer BU and the bit line BL whenever a voltage which exceeds the threshold voltage of the selector transistors AT1 and AT2 is connected to the word line. Then the channels K1 and K2 are formed along the edges of the V-shaped groove GR and, via these channels K1 and K2, charge can be exchanged between the buried layer BU and the bit line portions BLL and BLR.

In order to achieve as high as possible a storage capacitance, the form of the buried layer BU is selected accordingly. Here, it is advantageous to provide the buried layer BU with a spherical shape, or at least an approximately spherical shape. Then the buried layer has a very large surface and the blocking layer capacitance which arises at the boundary between the buried layer BU and the surrounding semiconductor substrate becomes correspondingly high.

The extent and position of two storage cells SZ1 and SZ2 and of the V-shaped groove can be seen from FIG. 3. Here, the storage cell SZ1 lies at the edge of the storage cell field. The V-shaped groove GR is etched over the entire region of the storage cell field on the semiconductor wafer. The sub-portions BLL and BLR which are thus formed recombine to form one single bit line BL at the end of the storage cell field. The individual storage cells are always formed at the intersection points between the word line WL and the bit line BL, and their portions BLL and BLR. Then the buried layer BU (illustrated in broken lines) is arranged beneath these intersection points. It can likewise be seen from FIG. 3 that the tip of the V-shaped groove extends into the buried layer and in fact into a zone SP.

As a result of this arrangement of the V-shaped groove GR, the bit line capacitance is relatively low. The bit line capacitance is in fact composed of two fundamental components. The first component comprises the overlap capacitance CU which exists between the bit line portions BLL and BLR and the conductor path portions LBL, LBR of the word line WL. The second capacitance component, the diffusion capacitance CD, exists between the bit line portions BLL and BLR and the surrounding epitaxial layer E. The position of the V-shaped groove GR now ensures that the areas which lie adjacent one another in order to form the overlap capacitance and the diffusion capacitance, are kept as small as possible. The overlap capacitances and diffusion capacitances are illustrated in principle in FIG. 4.

In order to improve the properties of the storage cells, a self-conducting layer $\pi$ can be arranged between the bit line BL and the buried layers BU. This self-conducting layer $\pi$ serves to shorten the length of the channels K1 and K2 (see e.g. *Electronics*, Dec. 25, 1975, page 50).

FIG. 4 illustrates the construction of the storage cells in the n-silicon gate technique. It can, of course, also be constructed in the p-channel technique. The word line can consist of polysilicon, but can also be constructed as a metal line.

The doping concentrations of the individual layers can have the following values:

p+ approximately $2 \times 10^{16}$ atoms per cm$^3$
p− approximately $3 \times 10^{15}$ atoms per cm$^3$
n+ approximately $10^{20}$ atoms per cm$^3$.

Although we have described our invention by reference to an illustrative embodiment, many changes and modifications may become apparent to those skilled in the art without departing from the spirit and scope of the invention. We therefore intend to include within the patent warranted hereon all such changes and modifications as may reasonably and properly be included within the scope of our contribution to the art.

We claim:

1. A semiconductor memory comprising:
a plurality of storage cells aligned in a row;
a plurality of word lines, each of said word lines crossing a respective one of said storage cells,
each of said storage cells including a pair of selector transistors and a storage capacitance formed and electrically connected to the respective word line by a structure comprising
a semiconductor substrate highly doped with a dopant of one conductivity type,
a buried layer in said substrate highly doped with a dopant of the opposite conductivity and with said substrate forming said storage capacitance,
an epitaxial layer weakly doped with dopant of the one conductivity type carried over said buried layer and said substrate,
a surface layer in the surface of said epitaxial layer over said buried layer of each of said memory cells, said surface layer being highly doped with dopant of the other conductivity type and forming a bit line,
a V-shaped groove extending longitudinally of said storage cells and dividing said surface layer and thus said bit line into two sub-portions and extending through said epitaxial layer into said buried layer of each of said memory cells,
an insulating layer carried over said epitaxial layer over said surface layer and over the surface of said groove, and
a conductive path carried by said insulating layer over said buried layer and forming the respective word line.

2. The memory of claim 1, wherein said conductive path extends at right angles to said bit line and is insulated therefrom.

3. The memory of claim 2, wherein said conductive path comprises polysilicon.

4. The memory of claim 1, wherein a self-conducting layer is formed between said epitaxial layer, said buried layer and said surface layer sub-portions.

5. The memory of claim 1, wherein said buried layer is of spherical shape.

6. The memory of claim 1, wherein said buried layer is of approximately spherical shape.

* * * * *